(12) United States Patent
Lee

(10) Patent No.: US 7,927,945 B2
(45) Date of Patent: Apr. 19, 2011

(54) METHOD FOR MANUFACTURING SEMICONDUCTOR DEVICE HAVING 4F2 TRANSISTOR

(75) Inventor: Jin Yul Lee, Icheon (KR)

(73) Assignee: Hynix Semiconductor Inc., Icheon-si (KR)

( * ) Notice: Subject to any disclaimer, the term of this patent is extended or adjusted under 35 U.S.C. 154(b) by 186 days.

(21) Appl. No.: 12/117,433

(22) Filed: May 8, 2008

(65) Prior Publication Data

US 2009/0170261 A1 Jul. 2, 2009

(30) Foreign Application Priority Data

Dec. 28, 2007 (KR) .................... 10-2007-0141018

(51) Int. Cl.
*H01L 21/8242* (2006.01)
*H01L 21/4763* (2006.01)
*H01L 27/108* (2006.01)
*H01L 29/94* (2006.01)

(52) U.S. Cl. ........ 438/239; 438/253; 438/637; 257/296; 257/311; 257/E21.649; 257/E21.657; 257/E21.658

(58) Field of Classification Search .................. 438/239, 438/253, 637; 257/296, 311, E21.649, E21.657, 257/E21.658

See application file for complete search history.

(56) References Cited

U.S. PATENT DOCUMENTS

| | | | |
|---|---|---|---|
| 5,202,279 A * | 4/1993 | Chung et al. | 438/386 |
| 6,355,520 B1 | 3/2002 | Park et al. | |
| 6,979,602 B1 | 12/2005 | Horch et al. | |
| 7,199,419 B2 | 4/2007 | Haller | |
| 7,285,812 B2 | 10/2007 | Tang et al. | |
| 2005/0218440 A1* | 10/2005 | Park | 257/298 |
| 2006/0108647 A1* | 5/2006 | Yuan | 257/396 |
| 2006/0163631 A1* | 7/2006 | Chen et al. | 257/296 |
| 2008/0079060 A1 | 4/2008 | Zhu | |

FOREIGN PATENT DOCUMENTS

JP 2002-094027 A 3/2002

* cited by examiner

*Primary Examiner* — Hsien-ming Lee
*Assistant Examiner* — Kevin Parendo
(74) *Attorney, Agent, or Firm* — Marshall, Gerstein & Borun LLP

(57) ABSTRACT

Provided is a method for manufacturing a semiconductor device having a 4F2 transistor. In the method, a gate stack is formed on a semiconductor substrate. A first interlayer dielectric including a contact hole which includes a first region and second regions Spacer layers are formed on both sides of the gate stack and a portion of the second region. Landing plugs are formed on the contact hole, a portion of the semiconductor substrate exposed by a thickness of the spacer layer, and a lateral side of the trench. A second interlayer dielectric is formed to separate the landing plug. The bit line contact plug is connected to a first portion of the landing plug that extends to the lateral side of the trench. The bit line stack is connected to the bit line contact plug. The storage node contact plug is connected to the first portion and a second portion of the landing plug located at a corresponding position in a diagonal direction.

13 Claims, 20 Drawing Sheets

A-A'

B-B'

A-A'

B-B'

A-A'

B-B'

A-A'

B-B'

A-A'

B-B'

A-A'

B-B'

METHOD FOR MANUFACTURING SEMICONDUCTOR DEVICE HAVING 4F2 TRANSISTOR

CROSS-REFERENCE TO RELATED APPLICATIONS

This patent claims priority to Korean patent application number 10-2007-0141018, filed on Dec. 28, 2007, which is incorporated by reference in its entirety.

TECHNICAL FIELD

The present invention relates to a semiconductor device, and more particularly, to a method for manufacturing a semiconductor device having a 4F2 transistor.

BACKGROUND

As a semiconductor device becomes more highly integrated, a design rule is reduced. As the design rule reduces, technology development of a highly integrated semiconductor memory device, for example, a dynamic random access memory (DRAM) device reaches a limit. Accordingly, research to reduce a unit area of a cell storing one bit is in progress.

A more highly integrated cell structure may be formed by realizing a 1K unit cell in 6F2 and 4F2, rather than 8F2, which is a general reference storing one bit However, us a 4F2 transistor to form a more highly integrated cell remains under development.

For manufacturing a 4F2 transistor, the source region and the drain region of a cell transistor, that is, the source region in a capacitor forming region where charges are stored, and the drain region discharging charges to a bit line should be manufactured in 1F2. For this purpose, research on a vertical type cell transistor structure where a source region and a drain region can be manufactured in 1F2 is being considered. The vertical type cell transistor has a structure in which the source region and the drain region of the transistor that operate a cell are formed up and down. The vertical pole type channel operates the transistor. That is, the operation of a 1K cell transistor can be realized within 4F2 by vertically forming, in the upper and lower portions, the source region and the drain region that have been formed in a horizontal shape in 8F2. However, as a level of difficulty increases in a vertical type cell transistor structure, it is difficult to predict the possible structure formations. Also, since a bit line is formed under the transistor, a considerable difficulty is expected in securing resistance and storage capacity of the bit line. Since the bit line should be formed by the source region and the drain region in the upper and lower portions, the bit line must be formed in the lower portion. However, this lower bit line cannot be formed in a metal stack structure. Therefore, for the bit line, an n-type impurity implanted silicon electrode is used or salisride formed through reaction with Si is used to overcome high resistance. Also, a cell region and a peripheral circuit region should be independently formed because of an integration difference between the cell region and the peripheral circuit region. That is, since the number of processes greater than the number of conventional processes is used, a process operation is complicated.

SUMMARY OF THE INVENTION

In one embodiment, a method for manufacturing a semiconductor device having a 4F2 transistor includes: forming a gate stack on a semiconductor substrate including a device isolation layer; forming a first interlayer dielectric including a contact hole including a first region exposing both sides of the gate stack, and second regions disposed at diagonal positions on both sides of the first region, respectively, and extending in a device isolation layer direction; forming spacer layers on both sides of the gate stack and the second regions of the contact hole of the first interlayer dielectric; forming a trench inside the semiconductor substrate by performing an etching process using the spacer layers as an etch mask and removing the spacer layers; forming landing plugs on the contact hole, a portion of the semiconductor substrate exposed by a thickness of the spacer layer, and a lateral side of the trench; forming a second interlayer dielectric configured to separate the landing plugs; forming a bit line contact plug connected to a first portion of the landing plug that extends to the lateral side of the trench, and a bit line stack connected to the bit line contact plug; and forming a storage node contact plug connected to a second portion of the landing plug which is located at a diagonal position of the first portion, and a storage node electrode connected with the storage node contact plug.

The device isolation layer may be formed in a line type on the semiconductor substrate.

A recess trench may expose the semiconductor substrate by a width of approximately 1 F in an x-axis direction and by a width of approximately 0.5 F in a y-axis direction of the semiconductor substrate.

A target of an ion implantation process may be set such that when the recess trench is formed to a depth of approximately 1200 to 2000 Å, an impurity region is located at approximately ⅔ to ¾ of a depth of the recess trench.

The second region of the opening formed in the first interlayer dielectric may be formed in a rectangular shape of approximately 0.5 F×0.25 F.

The bit line contact plug and the storage node contact plug may be formed in positions separated by approximately 0.5 F from the device isolation layer adjacent to the gate stack, respectively. The bit line contact plug and the storage node contact plug may be arranged at positions separated from each other in a diagonal direction.

DETAILED DESCRIPTION

Hereinafter, embodiments of a method for manufacturing a semiconductor device having a 4F2 transistor in accordance with the present invention will be described in detail with reference to the accompanying drawings.

Figure 1A:
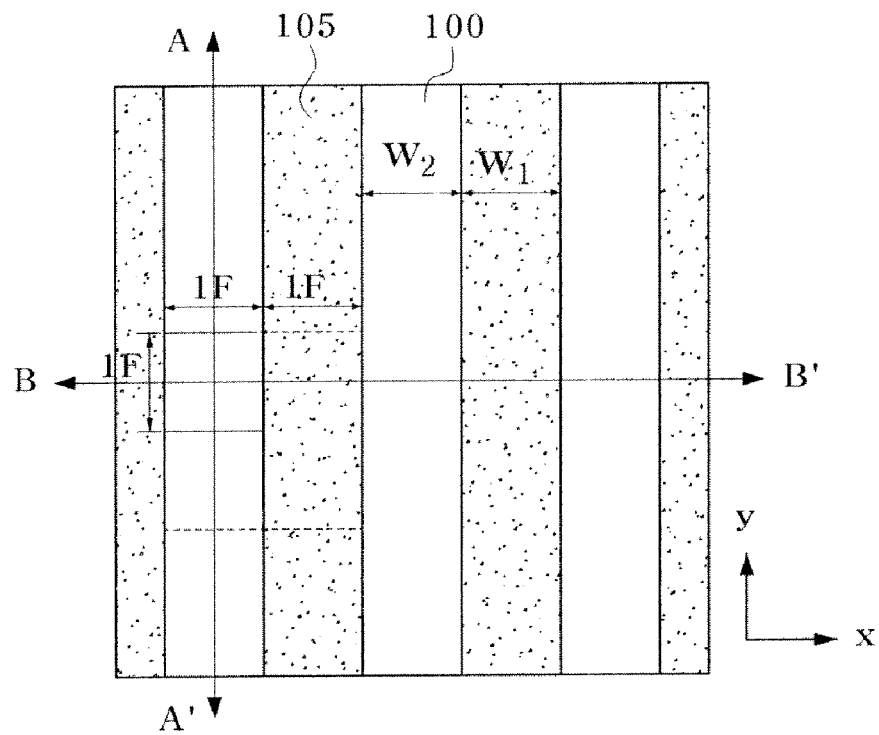
FIG. 1A to 11B illustrate a method for manufacturing a semiconductor device having a 4F2 transistor according to an embodiment of the present invention.
Figure 1B:
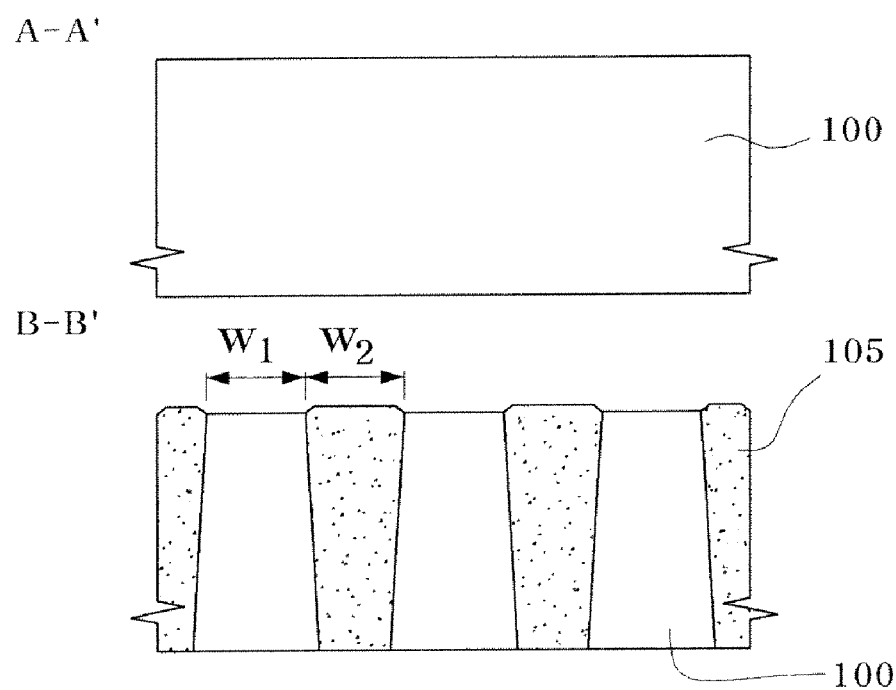

Referring to FIGS. 1A and 1B, a device isolation layer 105 defining an active region is formed inside a semiconductor substrate 100. Here, the device isolation layer 105 is disposed in one direction of the semiconductor substrate 100, for example, in a line type extending in a y-axis direction of the semiconductor substrate 100 as illustrated in FIG. 1A. At this point, the width w1 of the device isolation layer 105 and the width w2 of a portion of the semiconductor substrate 100 exposed by the device isolation layer 105 are arranged by an interval of 1 F, which is a unit area storing one bit in a semiconductor device. F is a minimum feature and F2 (F square) is a minimum feature size. A 4F2 cell is a cell having an area of four times of the minimum feature size. The device isolation layer 105 may be formed as a trench having a depth of approximately 2000 to 3000 Å inside the semiconductor substrate 100 and filling the trench with an insulating layer. The semiconductor substrate 100 is exposed to the direction A-A' of FIG. 1B by the device isolation layer 105 formed in the line type on the semiconductor substrate 100, and the active region is defined by the device isolation layer 105 along the direction B-B' of FIG. 1B, so that the semiconductor substrate 100 is partially exposed.

Figure 2A:
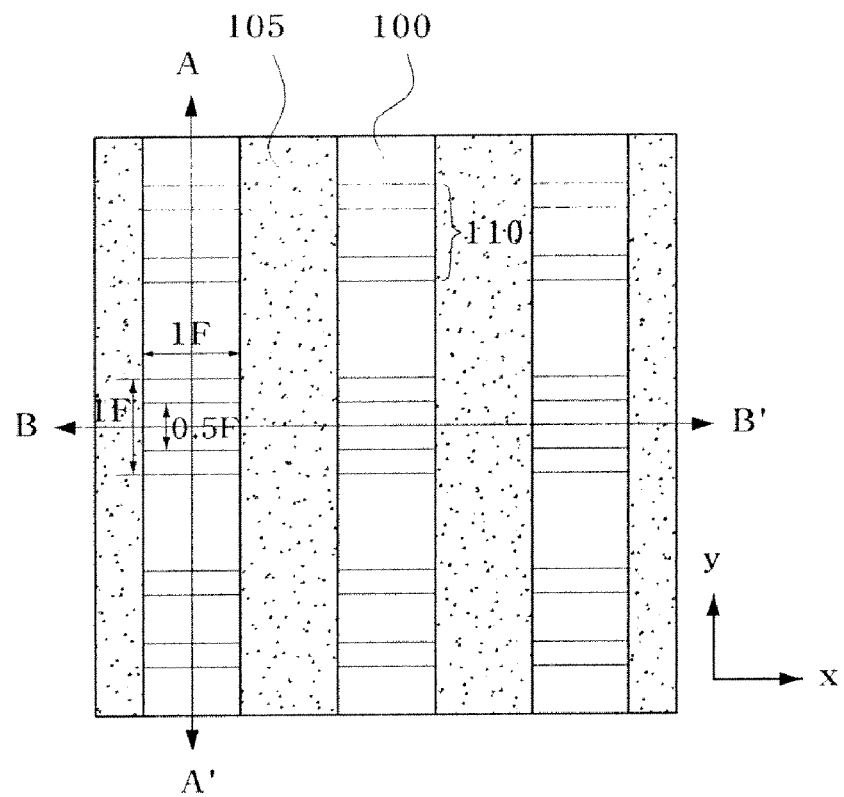
Figure 2B:
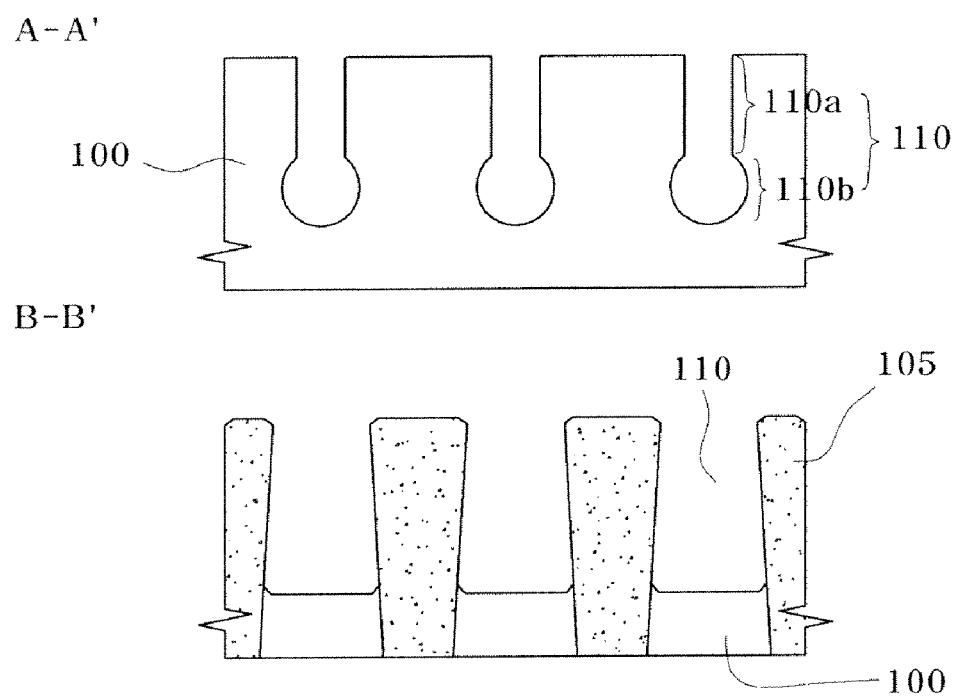

Referring to FIGS. 2A and 2B, recess trenches 110 are formed inside the semiconductor substrate 100. Specifically, mask layer patterns (not shown) are formed on portions of the semiconductor substrate 100 exposed by the device isolation layer 105. The mask layer patterns include openings disposed with a predetermined interval along the x-direction of the semiconductor substrate 100 and selectively exposing the semiconductor substrate 100. Next, recess trenches 110 are formed by etching the exposed portions of the semiconductor substrate 100 using the mask layer patterns as an etch mask. Referring to the cross-sectional view of FIG. 2B, taken along a line A-A', the recess trench 110 may be formed as a bulb type recess trench having a depth of approximately 1200 to 2000 Å and having a bulb shape in its lower portion. Here, referring to FIG. 2A, the entry portion of the recess trench 110 is exposed by a width of 0.5 F in the y-axis direction of the semiconductor substrate 100, and exposed by 1 F in the x-axis direction. At this point, in the case where the recess trench 110 is formed as the bulb type recess trench, the bottom area of the recess trench 110 is exposed to a width by a second trench 110b formed in the bulb shape wider than an upper first trench 110a having a neck shape (refer to FIG. 2B).

Figure 3A:
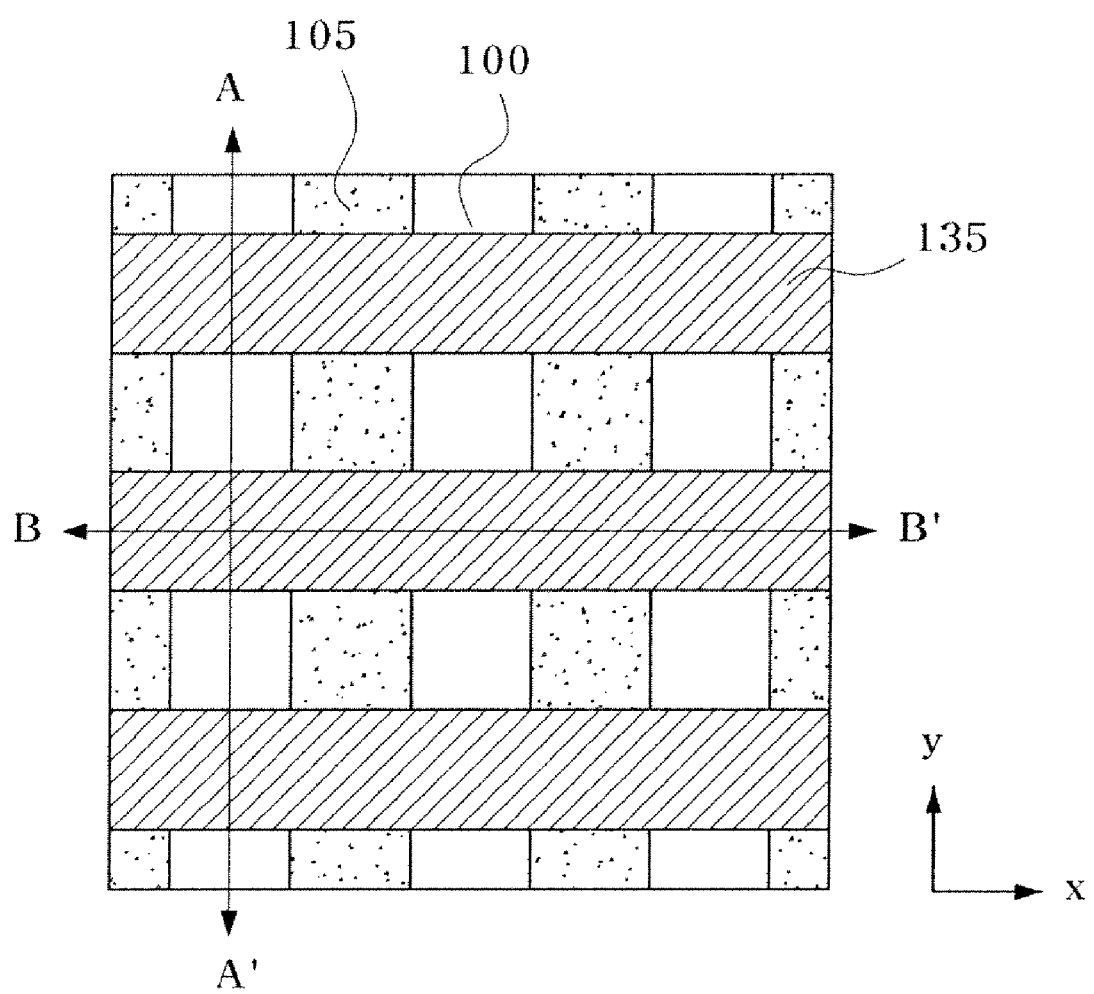
Figure 3B:
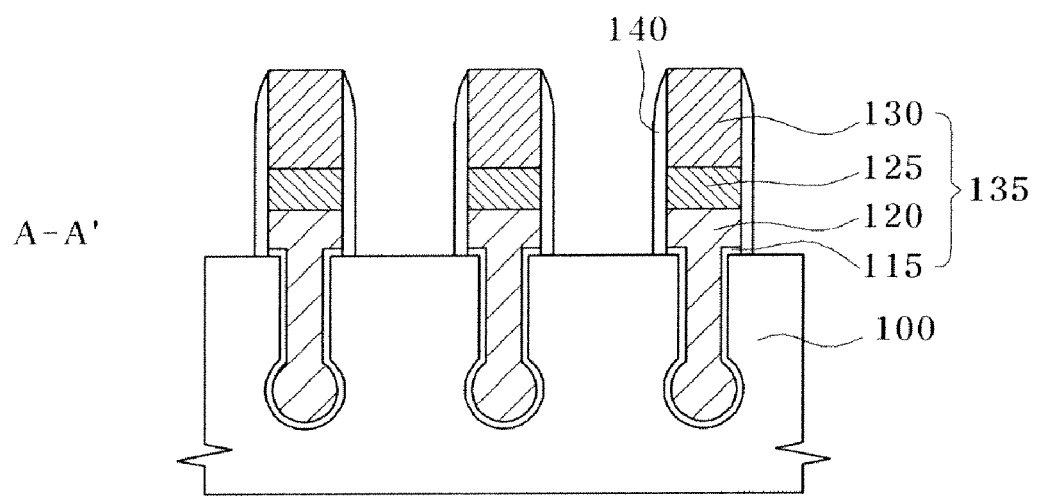
Figure 3B:
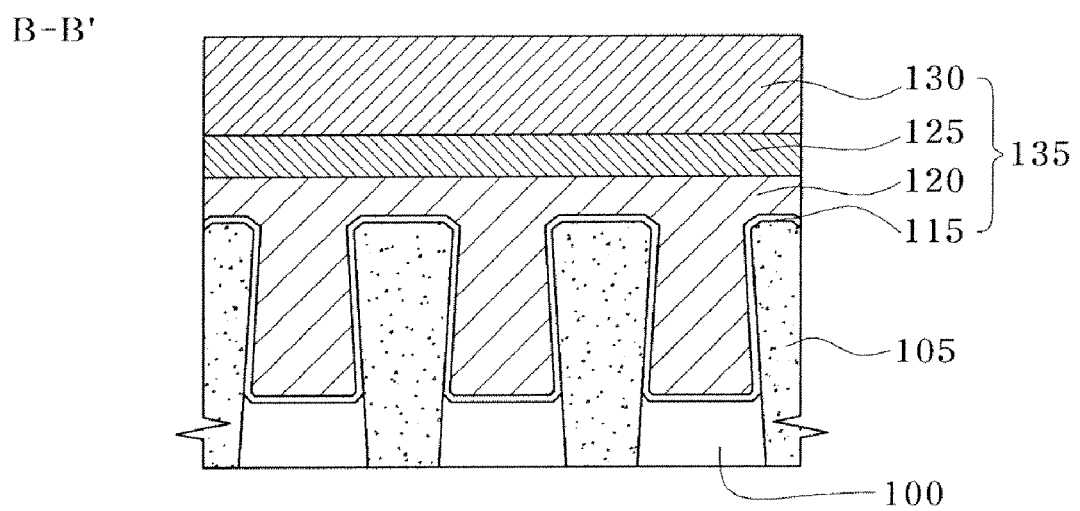

Referring to FIGS. 3A and 3B, gate stacks 135 overlapping the recess trench 110 are formed. The gate stack 135 has a structure in which a gate insulating layer pattern 115, a conductive layer pattern 120, a metal layer pattern 125, and a hard mask layer pattern 130 are stacked. Specifically, a gate insulating layer, a gate conductive layer, a metal layer, and a hard mask layer are formed on the semiconductor substrate 100 including the recess trenches 110. Here, the gate insulating layer is formed to have a thickness of approximately 50 to 60 Å using an oxidation process. The gate conductive layer is formed to have a thickness of approximately 600 to 1000 Å using a polysilicon layer. Also, the metal layer includes a tungsten layer or a tungsten silicide layer and is formed to have a thickness of approximately 300 to 500 Å. The hard mask layer includes a nitride layer and is formed to have a thickness of approximately 2000 to 3000 Å. Next, mask layer patterns (not shown) blocking regions corresponding to the recess trenches 110 are formed on the hard mask layer. Here, the mask layer patterns are formed in a line shape blocking portions of the semiconductor substrate that expose the recess trenches 110 and extending in the x-direction of the semiconductor substrate 100. Next, the lower layers are etched using the mask layer patterns as an etch mask to form the gate stacks 135 overlapping the recess trenches 110. Here, the gate stacks 135 are disposed in a line shape extending along the x-axis direction of the semiconductor substrate 100. Also, first spacer layers 140 are formed on both sides of each gate stack 135. The first spacer layer 140 can be a nitride layer.

Figure 4A:
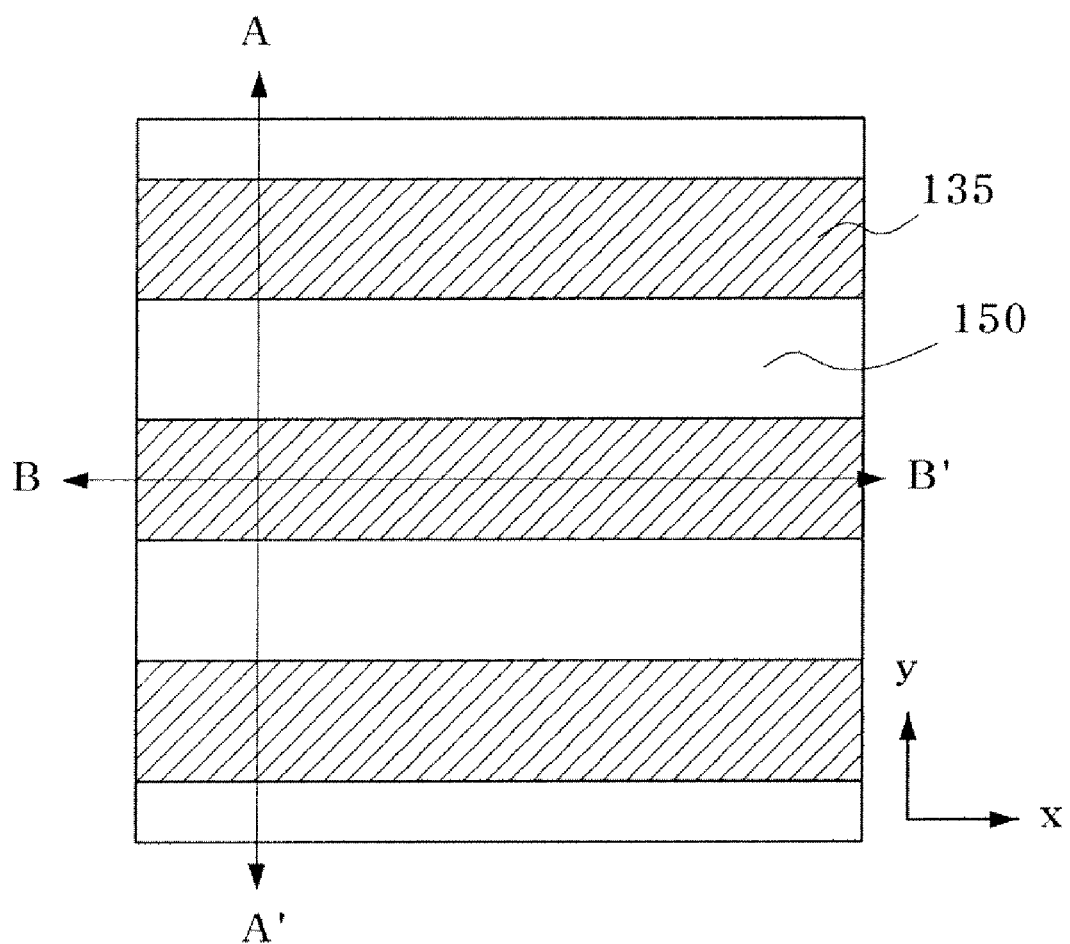
Figure 4B:
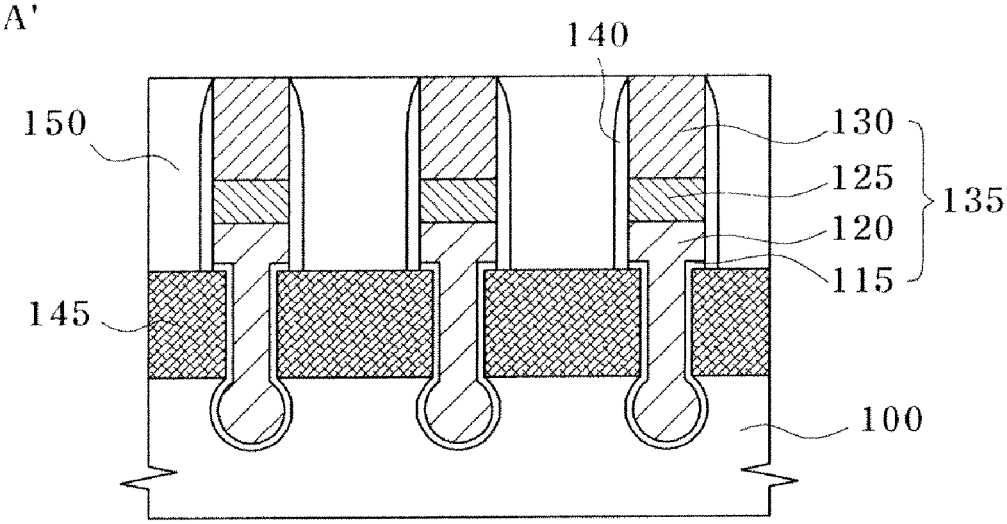
Figure 4B:
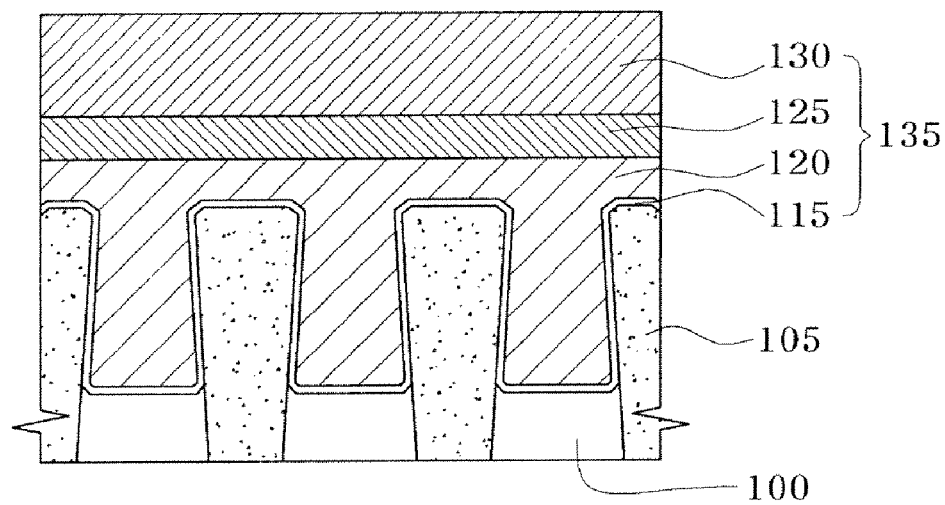

Referring to FIGS. 4A and 4B, an ion implantation process implanting impurities is performed to form impurity regions 145 inside the semiconductor substrate 100. Here, the target of ion implantation process may be set and performed such that when the recess trench is formed to a depth of approximately 1200 to 2000 Å, the impurity regions 145 are located at approximately ⅔ to ¾ of a depth of the recess trench 110. A process margin can be reduced within 1F2 by adopting the recess trench 110 to minimize the lateral direction of the impurity region 145 and using a portion of the impurity region secured along the depth direction of the semiconductor substrate 100 during formation of a 4F2 transistor. A unit area that can store one bit can be minimized to 4F2. That is, the reduced impurity region can be compensated for by reducing the lateral portion of the impurity region 145 and extending the impurity region in the depth direction of the recess trench 110.

Next, a first interlayer dielectric 150 is formed on the semiconductor substrate 100 including the gate stacks 135. The first interlayer dielectric 150 can include a spin-on-dielectric (SOD) or a boron phosphorus silicate glass (BPSG) layer. Next, a planarization process is performed on the first interlayer dielectric 150 to separate adjacent gate stacks 135. Here, the planarization process can be performed using a chemical mechanical polishing (CMP) method. Then, the gate stacks 135 are separated and the hard mask layer patterns 130 of the gate stacks 135 are exposed as illustrated in the cross-sectional view of FIG. 4B, taken along a direction B-B'.

Figure 5A:
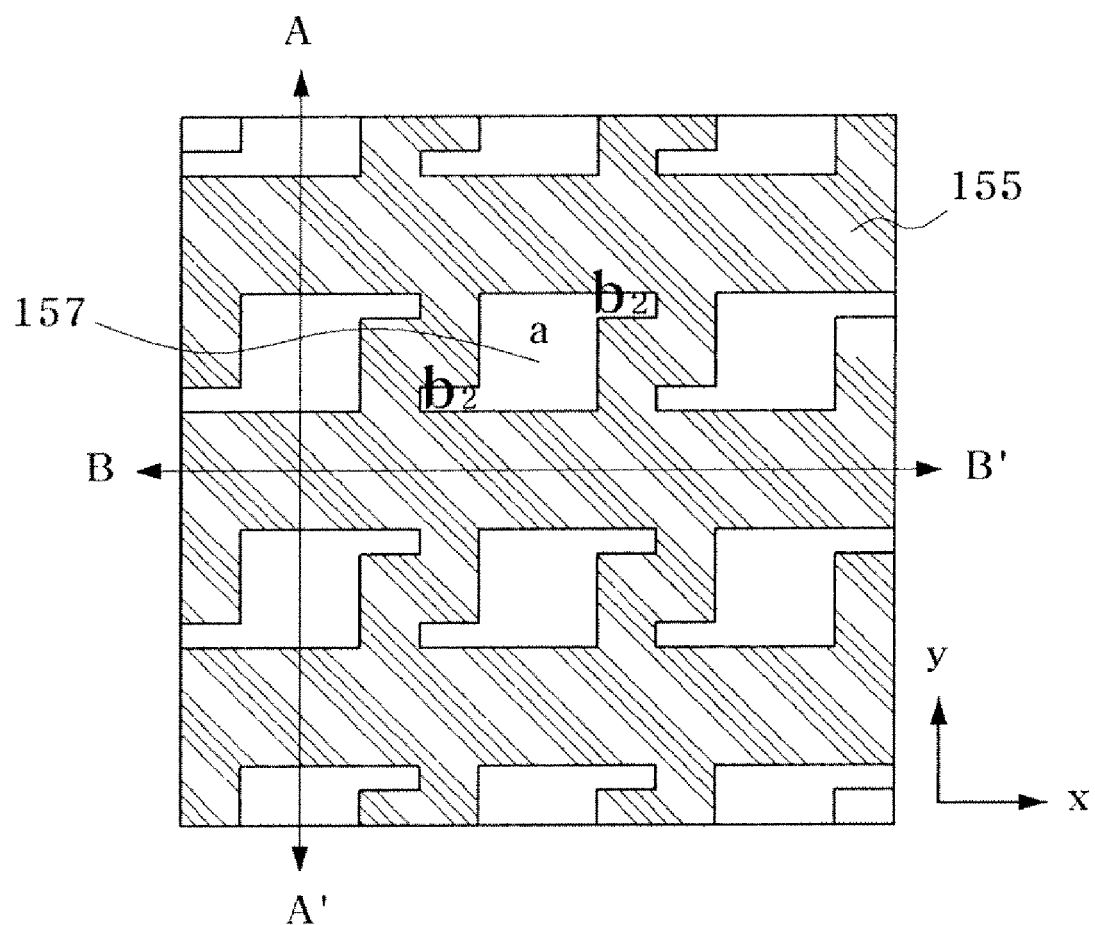
Figure 5B:
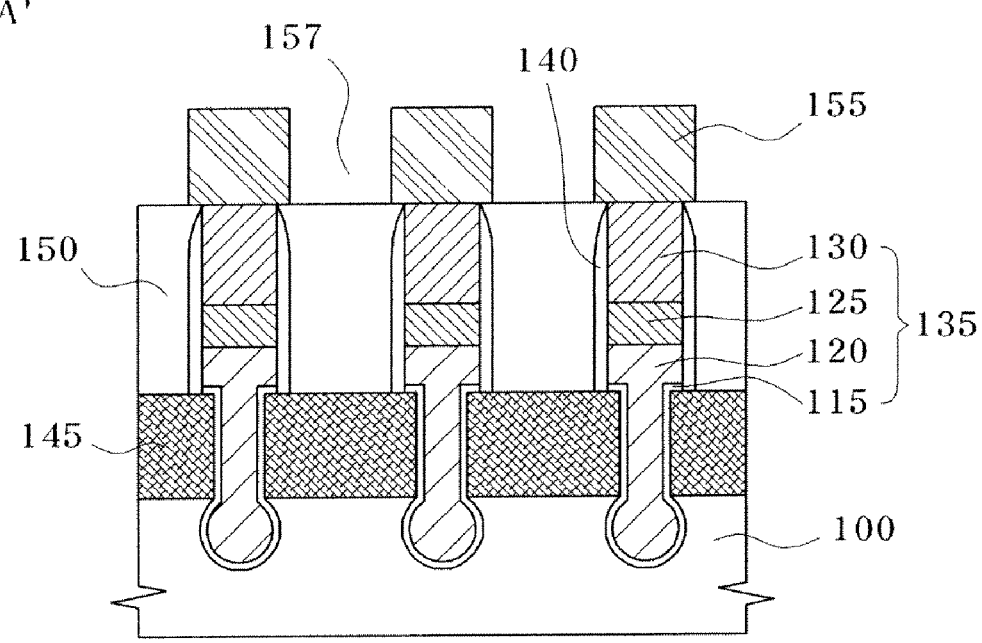
Figure 5B:
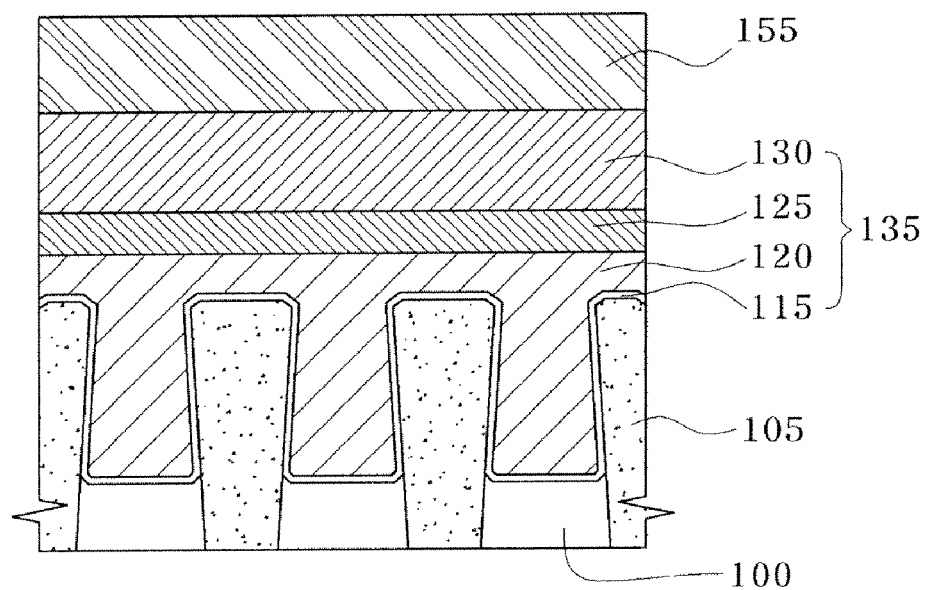

Referring to FIGS. 5A and 5B, photoresist layer patterns 155 defining a region where a landing plug is to be formed later are formed on the first interlayer dielectric 150 and the gate stacks 135. Specifically, a photoresist layer is formed on the semiconductor substrate 100 including the gate stacks 135. Next, a photolithography process including an exposure process and a developing process is performed on the photoresist layer to form the photoresist layer patterns 155 having openings 157 exposing portion of the first interlayer dielectric 150 where landing plugs are to be formed and blocking portions of the first interlayer dielectric 150 where the gate stacks 135 have been formed. Referring to FIG. 5A, the opening 157 of the photoresist layer patterns 155 includes a first region a exposing portions of the first interlayer dielectric 150 corresponding to both sides of the gate stack 135, and second regions b1 and b2 disposed at diagonal positions on both sides of the first region a and extending in a device isolation layer direction. That is, the first extension portion b1 of the second regions b1 and b2 is disposed at the upper end on one side of the first region a, and the second extension portion b2 is disposed at the lower end on the other side of the first region a that corresponds to the diagonal direction with respect to the first extension portion b1. The second regions b1 and b2 are regions where a bit line contact plug and a storage node contact plug are to be disposed. At this point, the first region a has a squire shape, and each of the second regions b1 and b2 have a rectangular shape. The second regions b1 and b2 additionally expose the first interlayer dielectric 150 by a space of 0.5 F×0.25 F. The opening 157 of the photoresist layer patterns 155 including the first region a and the second regions b1 and b2 has a space extending in the device isolation layer direction to improve contact areas with the landing plug and a lower structure that are to be formed later.

Figure 6A:
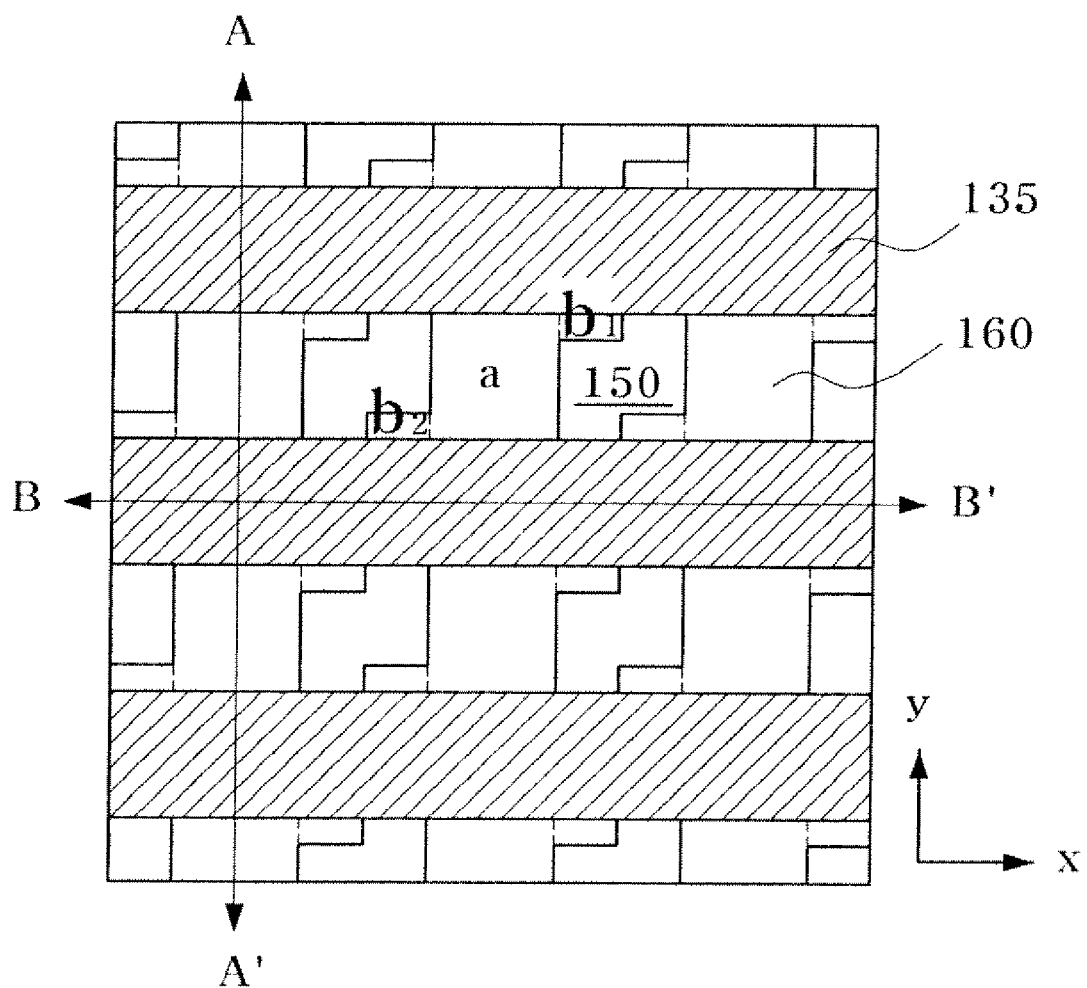
Figure 6B:
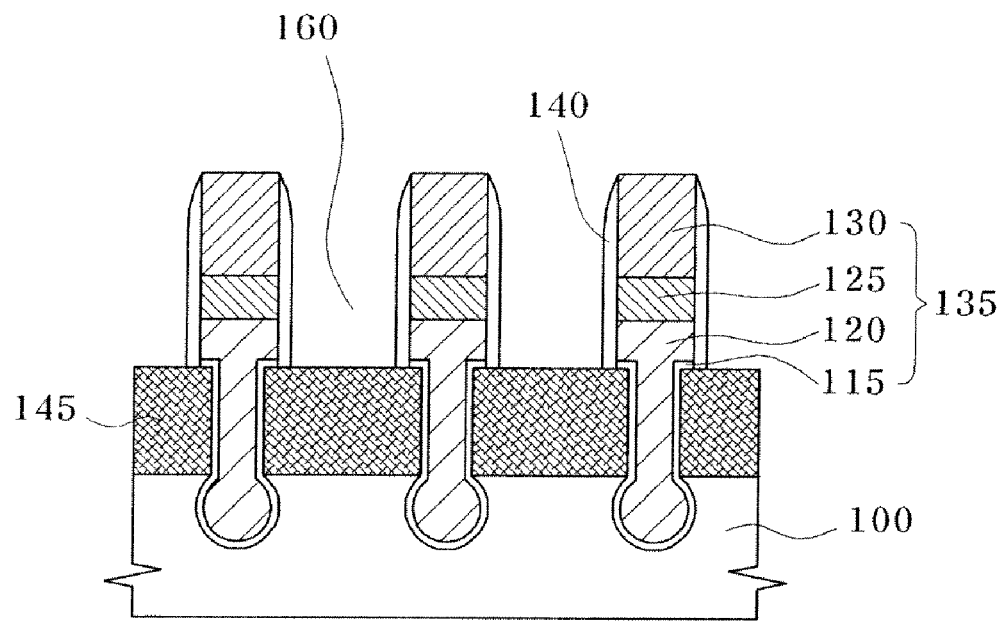
Figure 6B:
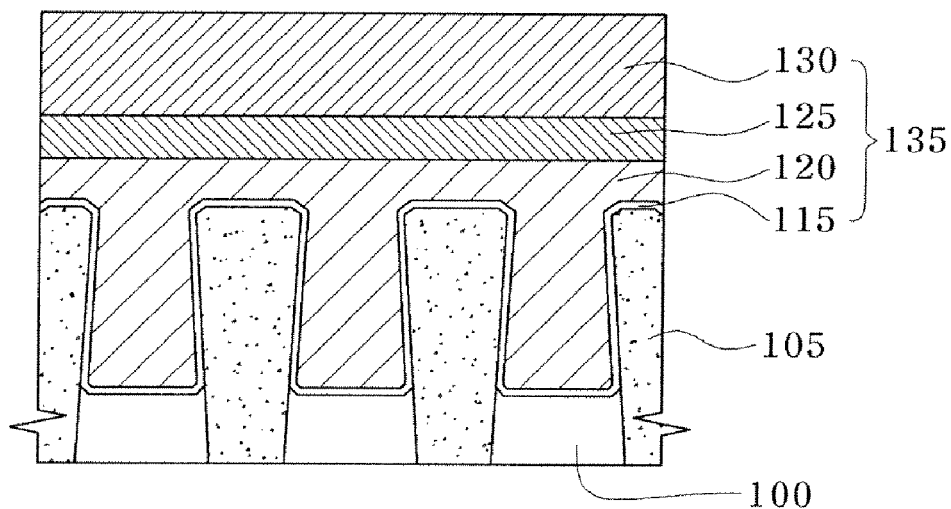

Referring to FIGS. 6A and 6B, an etching process is performed using the photoresist layer patterns 155 as a mask to form landing plug contact holes 160 inside the first interlayer dielectric 150. The landing plug contact hole 160 is formed by etching a portion of the interlayer dielectric 150 exposed by the opening 157 including the first region a and the second regions b1/b2 of the photoresist layer patterns 155. Accordingly, referring to FIG. 6A, the landing plug contact hole 160 is formed in a structure including the first region a exposing both sides of the gate stack 135, and the second regions b1 and b2 disposed at diagonal positions on both sides of the first region a and extending in the device isolation layer direction. The photoresist layer patterns 155 are removed.

Figure 7A:
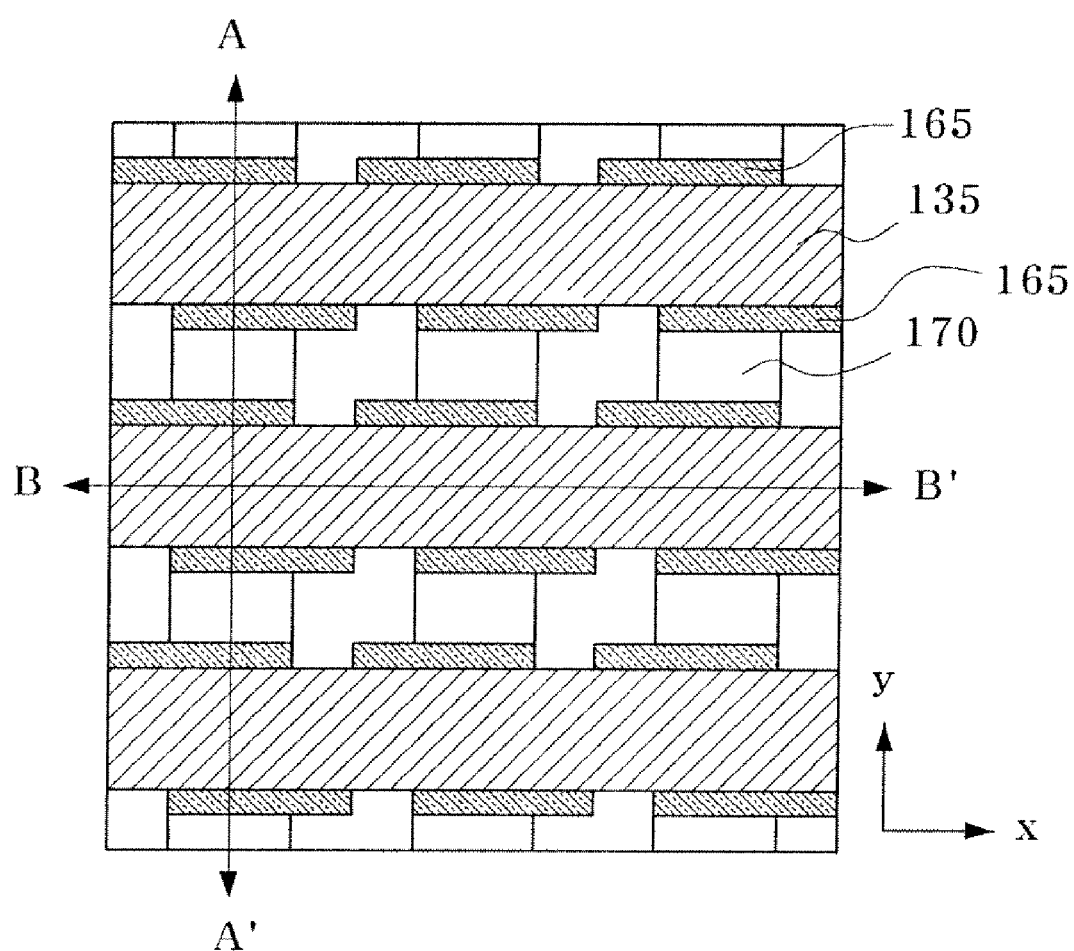
Figure 7B:
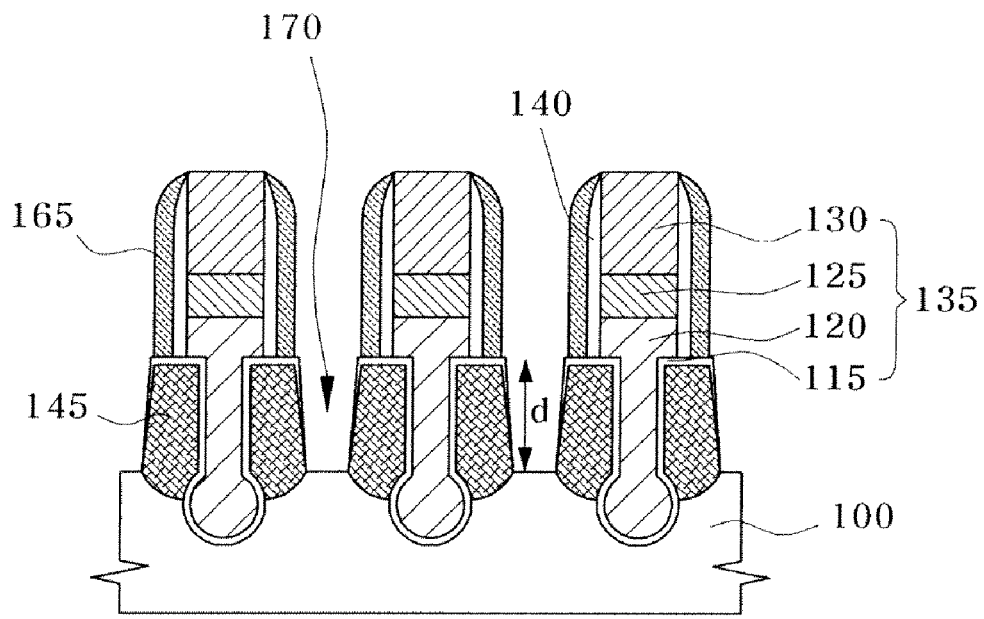
Figure 7B:
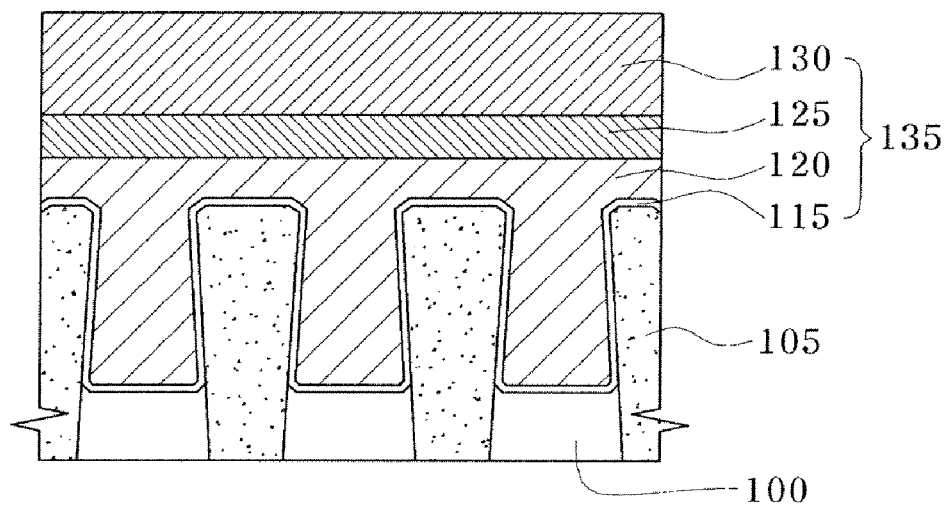

Referring to FIGS. 7A and 7B, a second spacer layer 165 is formed on the lateral side of the first spacer layer 140. Here, the second spacer layer 165 protrudes by a predetermined thickness from the lateral sides of the gate stack 135 and the first spacer layer 140 to cover the semiconductor substrate 100. Next, the exposed portion of the semiconductor substrate 100 is etched using the second spacer layer 165 as a mask to form a trench 170 having a predetermined depth d. Here, the trench 170 can be formed to have a thickness of approximately 600 to 1000 Å. Next, the second spacer layer 165 is removed using a strip process. When the second spacer layer 165 is removed, the surface of the semiconductor substrate 100 is exposed by the second spacer layer 165.

Figure 8A:
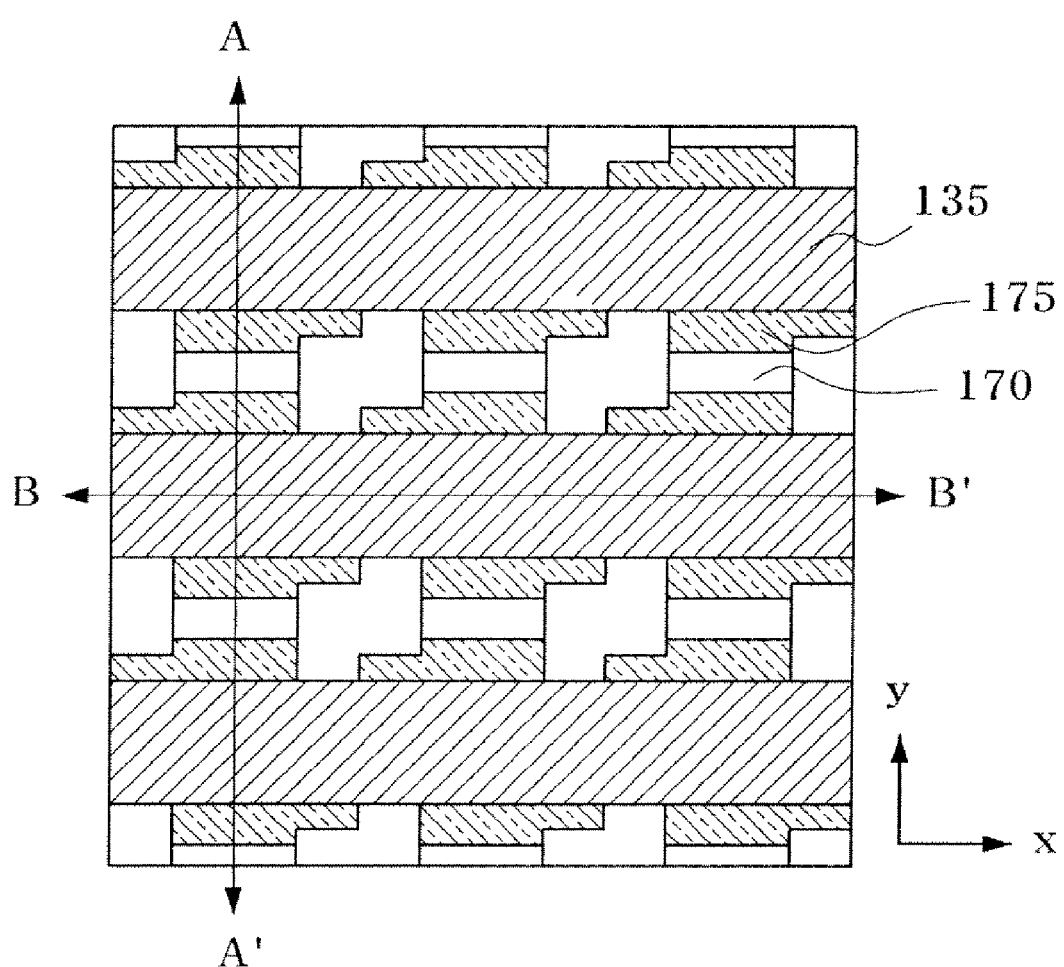
Figure 8B:
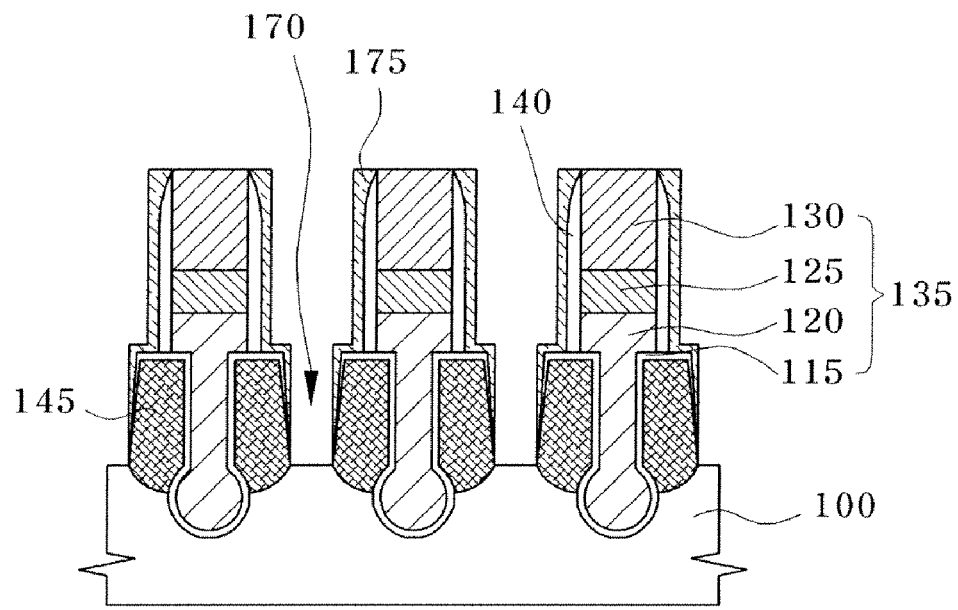
Figure 8B:
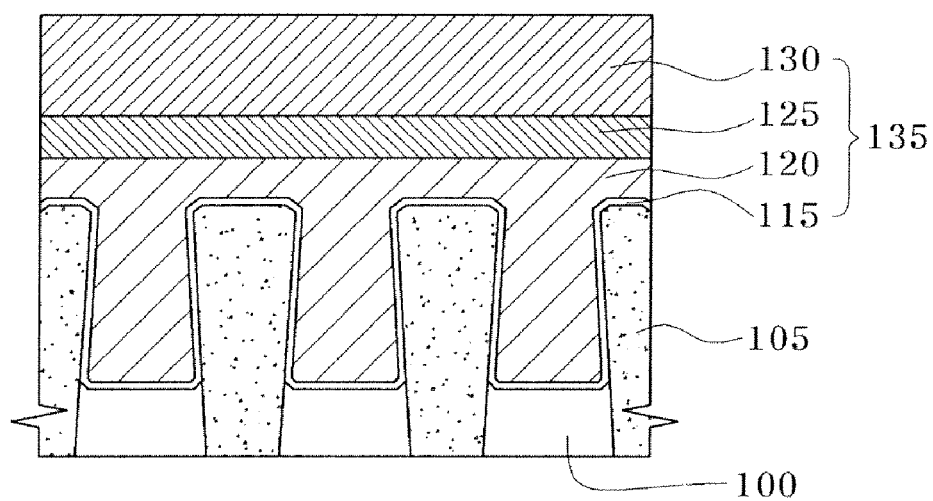

Referring to FIGS. 8A and 8B, a conductive layer is deposited on the semiconductor substrate 100 including the trench 170. The conductive layer is deposited using a polysilicon layer to have a thickness of approximately 50 to 300 Å. Subsequently, an etch back process is performed on the conductive layer to remove the conductive layer deposited on the bottom of the trench 170. A landing plug 175 is formed on both sides of the gate stack 135, the surface of the semiconductor substrate 100 exposed by the thickness of the second spacer layer, and the lateral side of the trench 170 by the etch back process. Here, the landing plug 175 extends up to the surface of the semiconductor substrate 100 exposed by the thickness of the second spacer layer, and the lateral side of the trench 170, so that the interface area of the landing plug 175 increases. Also, a region equivalent to a conventional 8F2 impurity region can be secured by utilizing both the upper portion and the lateral sides of the impurity region 145 as the interface of the landing plug 175.

Figure 9A:
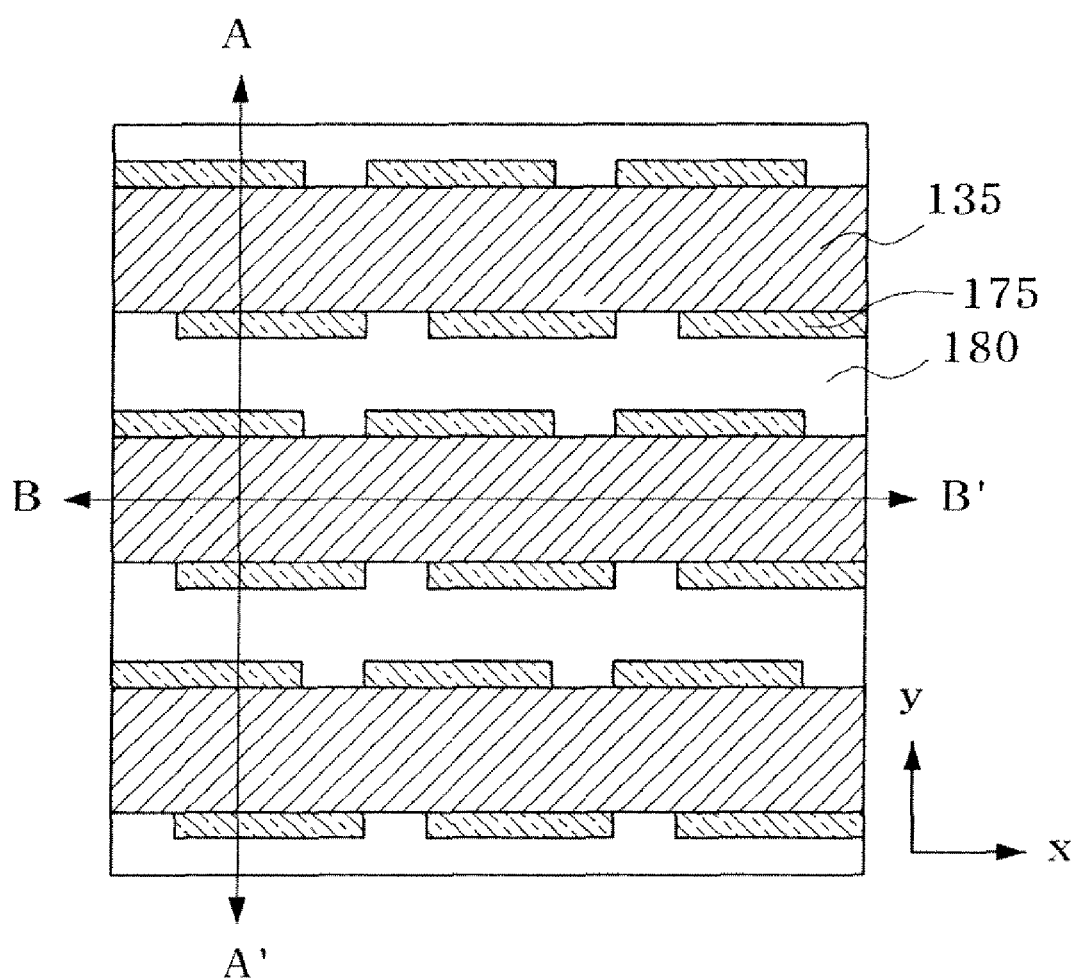
Figure 9B:
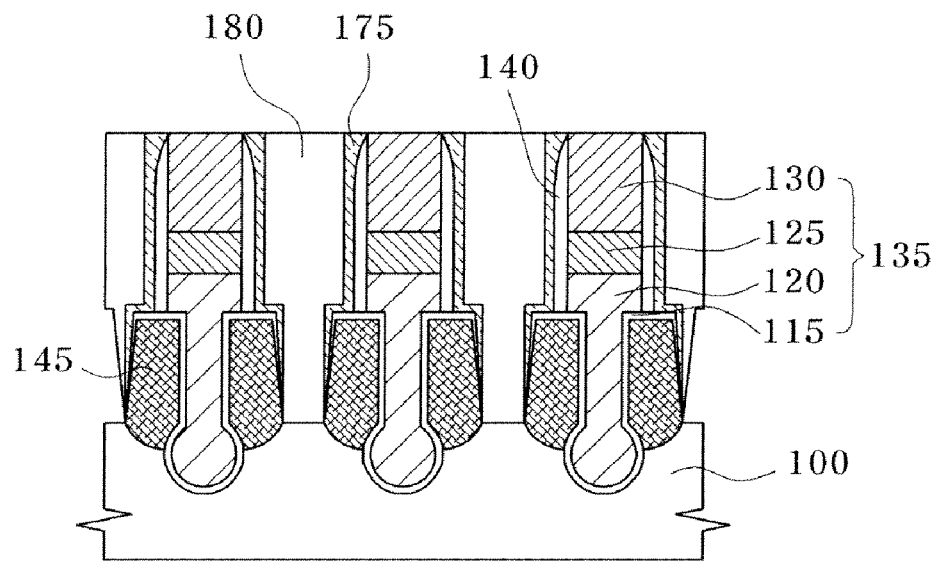
Figure 9B:
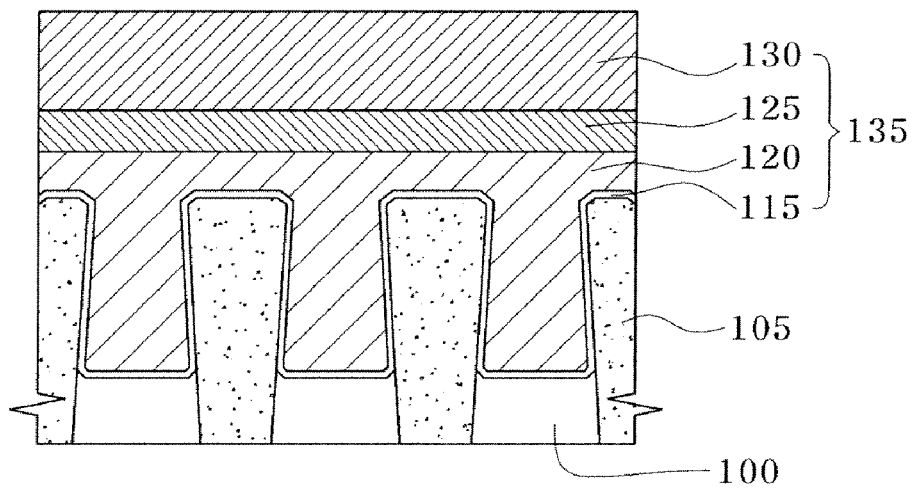

Referring to FIGS. 9A and 9B, a second interlayer dielectric 180 is formed on the semiconductor substrate 100 to fill the landing plug 175. Here, the second interlayer dielectric 180 can include a SOD or a BPSG layer. Next, a planarization process is performed on the second interlayer dielectric 180 to separate adjacent landing plugs 175. Here, the planarization process can be performed using a CMP method.

Figure 10A:
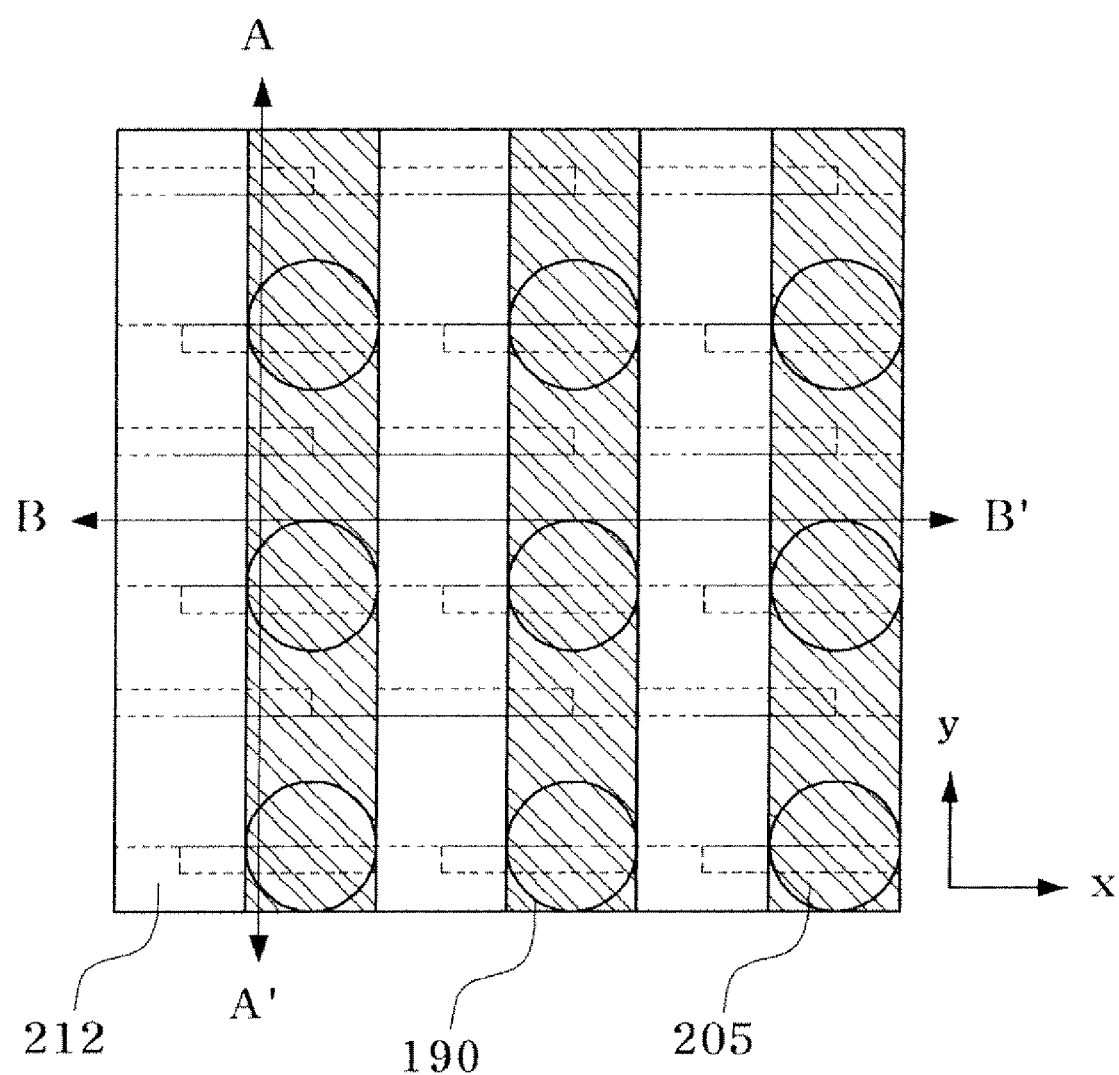
Figure 10B:
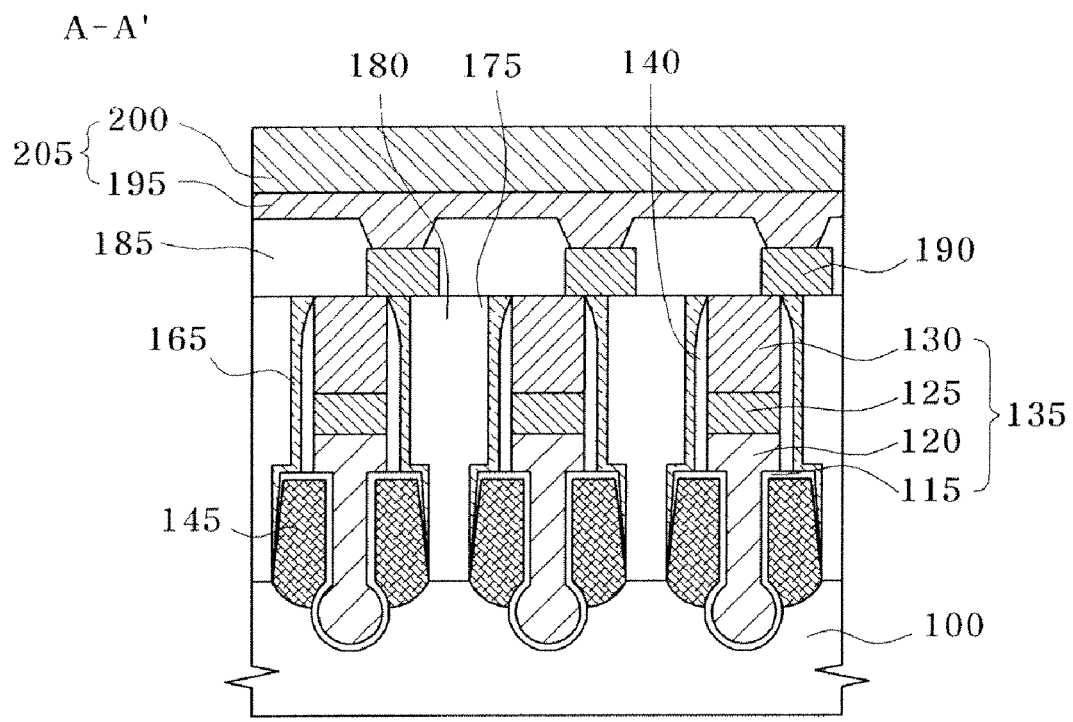
Figure 10B:
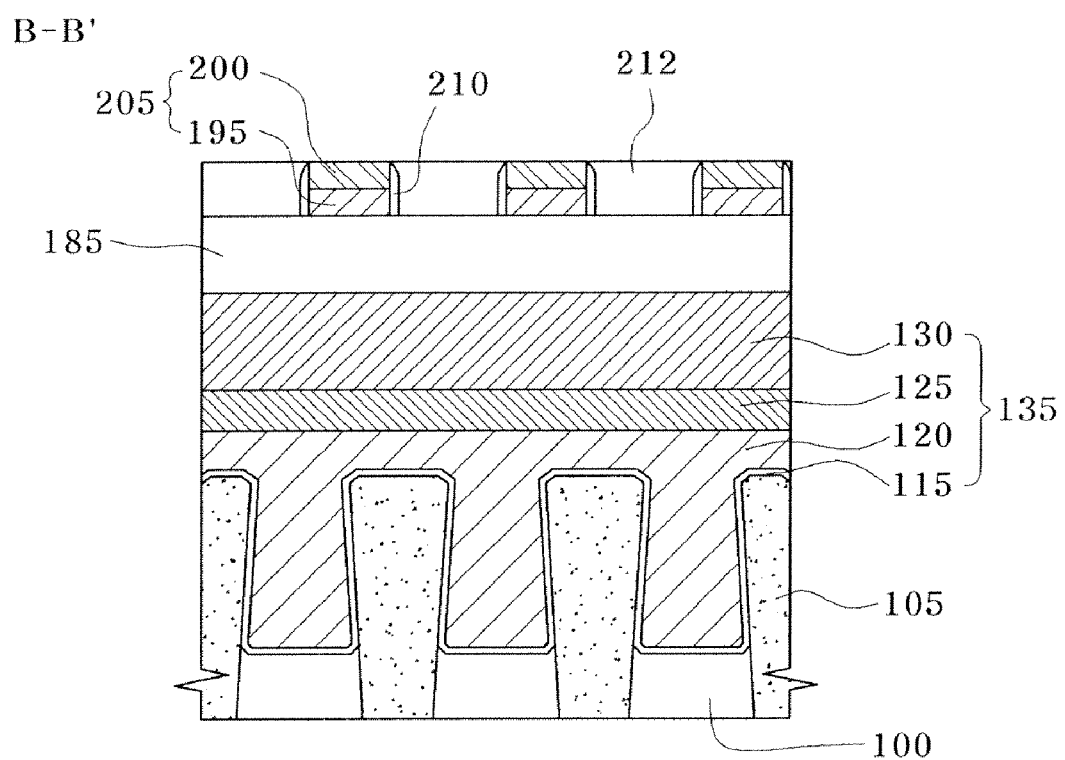

Referring to FIGS. 10A and 10B, a bit line contact plug 190 connected with a first portion of the landing plug 175 extending to the lateral side of the trench, and a bit line stack 205 connected with the bit line contact plug 190 are formed. Specifically, a third interlayer dielectric 185 is formed on the second interlayer dielectric 180. Next, the third interlayer dielectric 185 is patterned to form a bit line contact hole exposing the first portion of the landing plug 175. Next, the bit line contact hole is filled with a conductive material, and a planarization process is performed, so that a bit line contact plug 190 is formed. Here, since the bit line contact plug 190 is formed at a position separated by 0.5 F from the device isolation layer adjacent to the gate stack 135 as illustrated in FIG. 10A, a pitch between the bit line contact plug 190 and a storage node contact plug to be formed later can be maximized. Subsequently, a bit line stack 205 including a bit line metal line 195 and a bit line hard mask layer 200 is formed on the bit line contact plug 190 and the third interlayer dielectric 185, and bit line spacer layers 210 are formed on both sides of the bit line stack 205, respectively. Also, a fourth interlayer dielectric 212 separating adjacent bit line stacks 205 is formed. Here, the bit line stack 205 extends in a direction perpendicular to a direction along which the gate stack 135 extends. For example, in the case where the gate stack 135 extends in the x-axis direction of the semiconductor substrate 100, the bit line stack 205 extends in the y-axis direction of the semiconductor substrate 100.

Figure 11A:
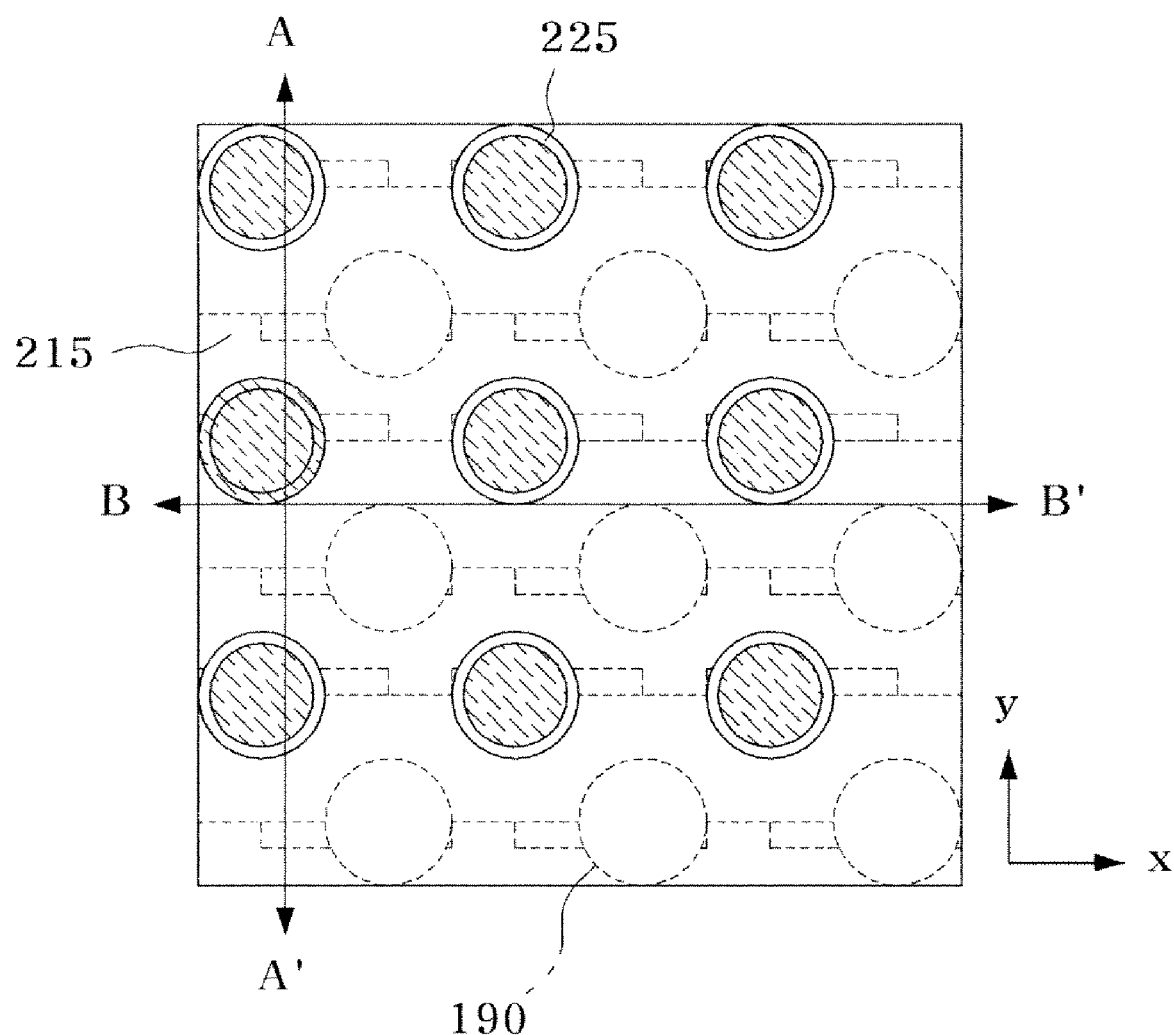
Figure 11B:
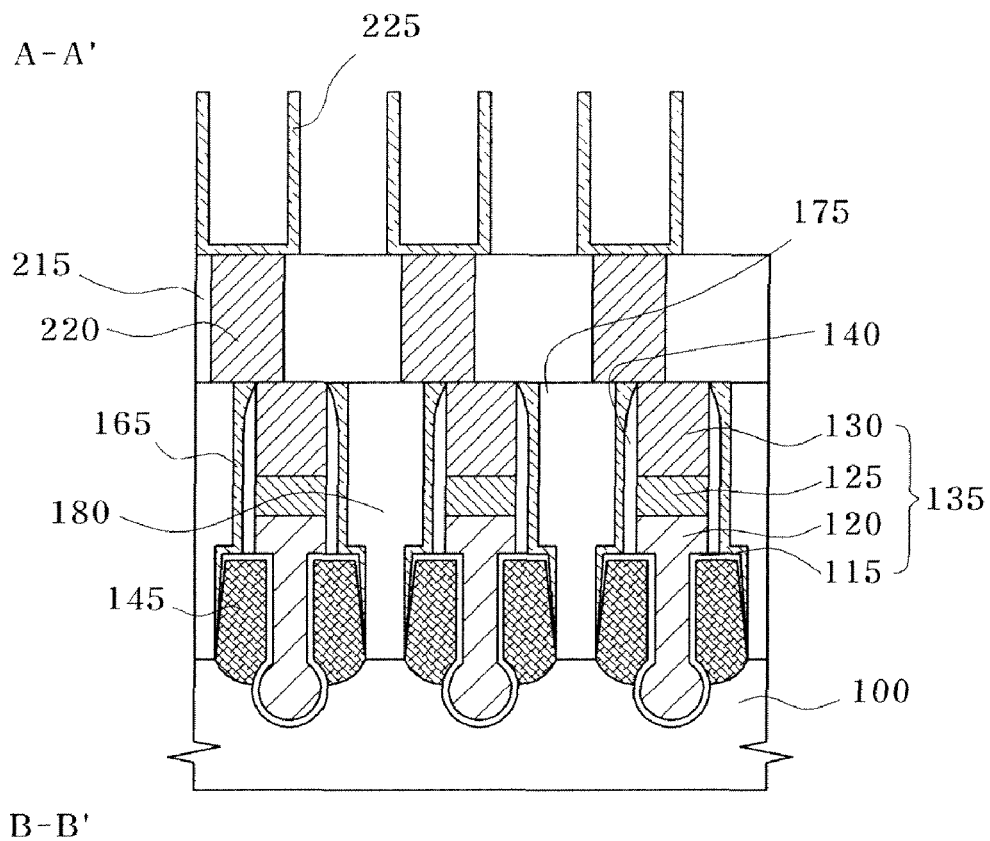
Figure 11B:
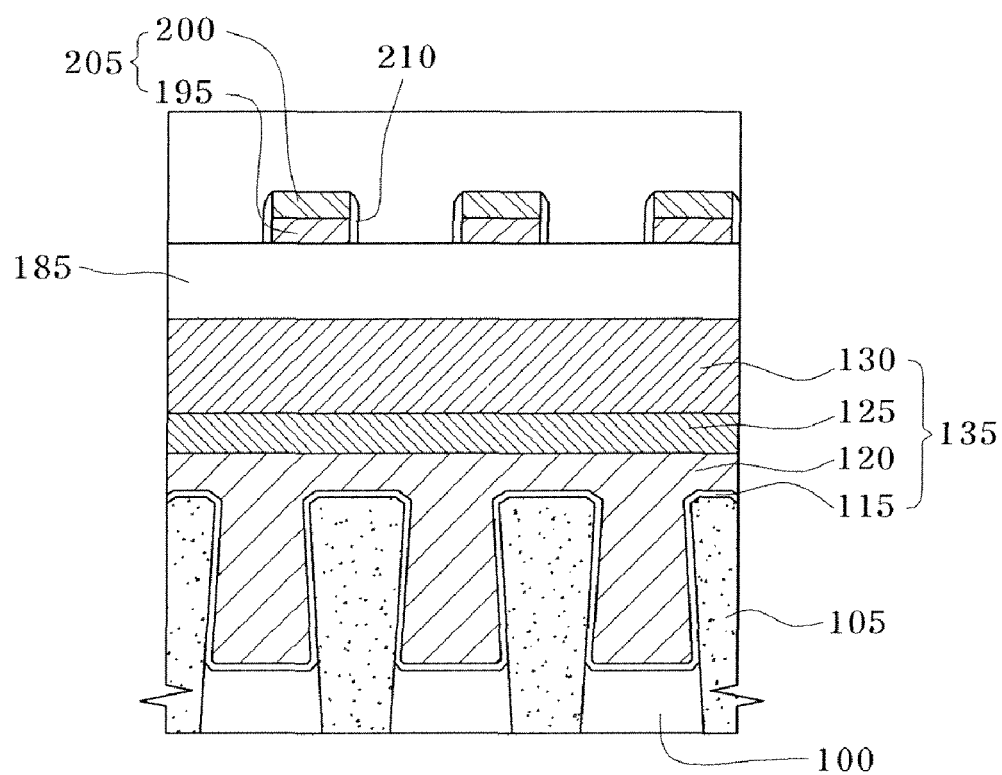

Referring to FIGS. 11A and 11B, a storage node contact plug 220 and a storage node electrode 225 connected with the storage node contact plug 220 is formed. The storage node contact plug 220 is connected with the first portion of the landing plug 175 extending to the lateral side of the trench, and a second portion at a diagonal position corresponding to that of the first portion. Specifically, a fifth interlayer dielectric 215 is formed on the fourth interlayer dielectric 212. Next, the fifth interlayer dielectric 215 is patterned to form a storage node contact hole exposing the second portion of the landing plug. Next, the storage node contact hole is filled with a conductive layer, and then a planarization process is performed to form a storage node contact plug 220. Here, the storage node contact plug 220 is formed at a diagonal position corresponding to that of the First portion of the landing plug 175. At this point, the storage node contact plug 220 is disposed at a position separated by 0.5 F from the device isolation layer adjacent to the gate stack 135 as illustrated in FIG. 11A. Accordingly, the storage node contact plug 220 and the bit line contact plug 190 are disposed at positions separated by 0.5 F to maximize a pitch. Next, a storage node electrode 225 is formed on the storage node contact plug 220. Specifically, a storage node insulating layer (not shown) is formed on the storage node contact plug 220 and the fifth interlayer dielectric by a height in which the storage node electrode 225 is formed. Next, the storage node insulating layer is etched to form a trench inside the storage node insulating layer. Subsequently, a storage node metal layer is formed on the trench and the storage node insulating layer. Next, the storage node metal layer is separated to form the storage node electrode 225.

Although preferred embodiments of the invention have been disclosed for illustrative purposes, those skilled in the art will appreciate that various modifications, additions and substitutions are possible, without departing from the scope and spirit of the invention as defined in the accompanying claims.

What is claimed is:

1. A method for manufacturing a semiconductor device having a 4F2 transistor, the method comprising:
    forming a device isolation layer defining an active region on a semiconductor substrate, wherein the active region is disposed in a shape of a vertical stripe;
    forming gate stacks on the active region of the semiconductor substrate;
    forming a first interlayer dielectric to fill between adjacent gate stacks;
    forming a contact hole through the first interlayer dielectric, the contact hole including a first region exposing portions of two facing sides of the adjacent gate stacks, and two second regions extending outwardly from the first region in opposite directions to expand the exposed portions of the two facing sides of the adjacent gate stacks from two diagonally opposed corners of the first region;
    forming spacer layers on the exposed portions of the two facing sides of the adjacent gate stacks, including filling the two second regions of the contact hole;
    forming a trench inside the semiconductor substrate by performing an etching process using the spacer layers as an etch mask and then removing the spacer layers;
    forming first and second landing plugs on the two facing sides of the adjacent gate stacks, respectively, exposed by the first region and the two second regions of the contact hole, on a portion of the semiconductor substrate exposed by removing the spacer layers, and on a lateral side of the trench, wherein the first and second landing plugs partially fill the contact hole while exposing a bottom surface of the trench;

filling the trench with a second interlayer dielectric to separate the first and second landing plugs;

forming a bit line contact plug connected to the first landing plug and a bit line stack connected to the bit line contact plug; and forming a storage node contact plug connected to the second landing plug and a storage node electrode connected to the storage node contact plug.

2. The method of claim 1, wherein the forming of the gate stacks comprises:

forming recess trenches inside the active region of the semiconductor substrate;

forming the gate stacks overlapping the recess trenches; and forming an impurity region inside the semiconductor substrate by performing a junction ion implantation process on the semiconductor substrate.

3. The method of claim 2, wherein each of the recess trenches exposes the semiconductor substrate by a width of approximately 1 F in an x-axis direction and by a width of approximately 0.5 F in a y-axis direction of the semiconductor substrate, where F is a minimum feature size.

4. The method of claim 2, wherein a target of the ion implantation process is set such that when the recess trenches are formed to a depth of approximately 1200 to 2000 Å, the bottom of the impurity region is located at approximately $2/3$ to $3/4$ of a depth of the recess trenches.

5. The method of claim 1, wherein the second regions of the contact hole formed in the first interlayer dielectric are formed in a rectangular shape of approximately 0.5 F ×0.25, where F is a minimum feature size.

6. The method of claim 1, wherein the spacer layer comprises a nitride layer.

7. The method of claim 1, wherein the trench is formed to have a depth of approximately 600 to 1000 Å from a surface of the semiconductor substrate.

8. The method of claim 1, wherein one of the first interlayer dielectric and the second interlayer dielectric comprises one of a spin-on-dielectric (SOD) and a boron phosphorous silicate glass (BPSG) layer.

9. The method of claim 1, wherein the forming of the first and second landing plugs comprises:

depositing a conductive layer on the semiconductor substrate after the removing of the spacer layers; and forming the first and second landing plugs on the two facing sides of the adjacent gate stacks, respectively, on a portion of the semiconductor substrate exposed by the thickness of the spacer layer, and on the lateral side of the trench by removing the conductive layer on the bottom surface of the trench.

10. The method of claim 9, wherein the conductive layer comprises a polysilicon layer deposited to have a thickness of approximately 50 to 300 Å.

11. The method of claim 9, wherein the conductive layer is removed using one of an etch back process and a chemical mechanical polishing (CMP) process.

12. The method of claim 1, wherein the bit line contact plug and the storage node contact plug are formed on positions that are separated by approximately 0.5 F from the device isolation layer adjacent to the gate stacks, respectively.

13. The method of claim 1, wherein the bit line contact plug and the storage node contact plug are arranged at positions separated from each other in a diagonal direction.

* * * * *